(12) United States Patent
Heinemann

(10) Patent No.: US 6,602,127 B2
(45) Date of Patent: Aug. 5, 2003

(54) PLANT FOR PRODUCING SEMICONDUCTOR PRODUCTS

(75) Inventor: Bernhard Heinemann, Greifenberg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/963,957

(22) Filed: Sep. 26, 2001

(65) Prior Publication Data

US 2002/0040568 A1 Apr. 11, 2002

Related U.S. Application Data

(63) Continuation of application No. PCT/DE00/00941, filed on Mar. 24, 2000.

(30) Foreign Application Priority Data

Mar. 26, 1999 (DE) .......................... 199 13 886

(51) Int. Cl.[7] ................................. B01L 1/04
(52) U.S. Cl. ..................... 454/187; 414/217.1
(58) Field of Search .................. 454/187; 414/217.1, 414/935, 939, 940

(56) References Cited

U.S. PATENT DOCUMENTS

| | | | | |
|---|---|---|---|---|
| 3,672,128 A | * | 6/1972 | Heffron ..................... | 165/7 |
| 4,699,640 A | * | 10/1987 | Suzuki et al. ............... | 454/188 |
| 4,838,150 A | | 6/1989 | Suzuki et al. | |
| 5,053,064 A | * | 10/1991 | Hama et al. ................ | 454/187 |
| 5,058,491 A | * | 10/1991 | Wiemer et al. ............. | 454/187 |
| 5,096,477 A | * | 3/1992 | Shinoda et al. ............. | 454/187 |
| 5,259,812 A | | 11/1993 | Kleinsek | |
| 5,316,518 A | * | 5/1994 | Challenger .................. | 454/187 |
| 6,120,371 A | * | 9/2000 | Roberson et al. ........... | 414/940 |
| 6,333,003 B1 | * | 12/2001 | Katano et al. .............. | 118/326 |
| 6,390,755 B1 | * | 5/2002 | Grant et al. ............... | 414/217.1 |

FOREIGN PATENT DOCUMENTS

| | | |
|---|---|---|
| EP | 0 335 752 A2 | 10/1989 |
| EP | 0 450 142 A2 | 10/1991 |
| JP | 11074193 | 3/1999 |

OTHER PUBLICATIONS

International Search Report for PCT/DE00/00941, issued by the European Patent Office on Oct. 6, 2000.

Urs Bachmann et al.: "Quellüftung senkt Klimatisierungskosten in Webereien und Spinnereien", Technische Rundschau Sulzer, vol. 3, 1991, pp. 29–32, (expansion air guiding system for reducing air–conditioning cost in weaving and spinning mills).

\* cited by examiner

Primary Examiner—Derek Boles
(74) Attorney, Agent, or Firm—Laurence A. Greenberg; Werner H. Stemer; Ralph E. Locher

(57) ABSTRACT

A plant for producing semiconductor products that includes at least one clean room having a floor and a plurality of production units that are configured in the clean room. The plurality of the production units define processing locations for processing semiconductor products. The processing locations are located near the floor of the clean room. The plant also includes an air supply system for directly feeding in feed air at the processing locations. The circulation of feed air and waste air caused by the force of gravity is utilized so that feed air is made available with little energy expenditure.

36 Claims, 2 Drawing Sheets

PLANT FOR PRODUCING SEMICONDUCTOR PRODUCTS

CROSS-REFERENCE TO RELATED APPLICATION

This application is a continuation of copending International Application No. PCT/DE00/00941, filed Mar. 24, 2000, which designated the United States.

BACKGROUND OF THE INVENTION

Field of the Invention

The invention relates to a plant for producing semiconductor products that includes an air supply system and production units that are configured in at least one clean room. A production plant of this type for semiconductor products is disclosed in Pat. Abstr. of Japan, Vol. 1999, No. 8, Jun. 30, 1999 (1999-06-30) Kaufmans & JP11 074193 A (Tokyo Electron Ltd.), Mar. 16, 1999 (1999-03-16).

Plants of this type can be provided in particular for processing wafers. These plants include a large number of production units, with which different production processes for processing the wafers are carried out. These production processes are, in particular, etching processes, wet chemical processes, diffusion processes and various cleaning processes, such as CMP (Chemical Mechanical Polishing). For each of these production processes, one or more production units is or are provided.

The entire processing process of the wafers is subject to strict cleanliness requirements, so that the production units are configured in a clean room or in a system of clean rooms. The clean room or the system of clean rooms is normally configured on one floor of a building.

The clean room is supplied with feed air by means of an air supply system. In this case, the feed air is introduced into the clean room from top to bottom via the ceiling of the clean room. For this purpose, the feed air is normally led as far as the ceiling of the clean room via a duct system and from there is blown downward into the clean room by means of blowing devices. In addition, lines belonging to the duct system can be led from the ceiling of the clean room to production units that are partly or completely sealed off from the rest of the clean room. The feed air is then led in the lines of the duct system to blowing devices at the production units and is blown into the interior of the respective production unit via the blowing devices.

The supply of air via the ceiling of the clean room requires a considerable energy expenditure. This is based on the fact that considerable blower outputs are needed in order to guide the feed air from the ceiling as far as the floor area of the clean room. In this case, the high energy expenditure results first from the great distance from the ceiling to the floor of the clean room. Second, the feed air is generally cooler than the waste air to be led away from the clean room. The waste air is heated by the dissipation of heat from the surrounding plants, in particular, the production units and machines for driving the transport system that feeds the wafers to the production units within the plant. The heated waste air rises upward toward the ceiling of the clean room as a result of convection. The blowing devices therefore have to operate with a high blower output in order to blow the feed air downward against the rising waste air.

The same is true of the air supply to the production units. There, the feed air first has to be guided, via the lines of the duct system, from the ceiling of the clean room and downward to the production units. The typical distances of the lines are about 2.1 m to 4.3 m. Because of the size of this distance, a considerable energy expenditure is already required to lead the feed air as far as the production units. There, the feed air is normally blown downward again from the ceiling of the production unit. This again requires a high energy expenditure, since the feed air has to be blown downward against the rising, heated waste air in the production unit.

In addition, it is disadvantageous that the feed air has to meet more or less strict cleanliness requirements, in order that the production processes in the production units can be carried out satisfactorily.

Since the wafers are processed in the area of the floor of the clean room, the cleanliness requirements on the feed air must be met there. However, this can be achieved only with a great expenditure on costs and material, since the feed air blown in from the ceiling of the clean room is mixed with the already used and contaminated waste air as it flows downward in the clean room.

Published Japanese Patent Application JP11 074193 A (Tokyo Electron Ltd.), Mar. 16, 1999 (1999-03-16) describes a production plant for semiconductor products in which the air is supplied from above. This becomes clear in particular from FIGS. 2 and 5 of this document.

FIG. 6 and, in detail, FIG. 7 of the Japanese document show a device which is neither a production plant nor a clean room, but a filter device, which can be seen at the extreme bottom left of FIG. 5. This filter device contains spray nozzles, with which the air stream that is introduced into the filter at the bottom and that rises upward is wetted with pure water for the purpose of cleaning. The water that is collected in the water collecting tank is then irradiated with UV radiation in order to kill off any germs in the water. The air is supplied to the filter device from the bottom right by an air pump and is fed by a blower at the top left into an air duct. The air duct leads the air through a wall section in the ceiling area of the room shown in FIG. 5 of this document, from where the cleaned air is fed into the production room from above.

SUMMARY OF THE INVENTION

It is accordingly an object of the invention to provide a plant for producing semiconductor components which overcomes the above-mentioned disadvantageous of the prior art apparatus of this general type. In particular, it is an object of the invention to provide such a plant with an air supply system that can supply feed air with the required cleanness in the most efficient and cost-effective manner.

With the foregoing and other objects in view there is provided, in accordance with the invention, a plant for producing semiconductor products that includes at least one clean room having a floor and a plurality of production units that are configured in the clean room. The plurality of the production units define processing locations for processing semiconductor products. The processing locations are located near the floor of the clean room. The plant also includes an air supply system for directly feeding in feed air at the processing locations.

In the air supply system, the supply of air is provided via the floor of the clean room. A significant advantage of this air supply system is that, as a result, the circulation of feed air and waste air caused by the force of gravity is utilized, so that the feed air is made available, with little energy expenditure, at the locations for processing the semiconductor products.

These locations for processing the semiconductor products, in particular the different production units and transport devices and transfer stations of a transport system for transporting the semiconductor products, are located close to the floor of the clean room. The feed air therefore has to cover only a short distance from the floor of the clean room as far as the locations for processing the semiconductor products, so that only a low energy expenditure is needed for this purpose. This effect is further reinforced by the fact that the heated waste air rises upward in the clean room, and therefore does not have to be displaced by the feed air fed from the floor of the clean room.

In accordance with an added feature of the invention, the upwardly flowing waste air can be disposed of in this case via the ceiling of the clean room. This too is possible with little energy expenditure, so that extracting waste air by means of the convection of the waste air within the clean room is assisted.

In the air supply system, the feed air is fed in immediately at the processing locations of the semiconductor products, in the area of the floor. This feed air is cooler than the surrounding waste air which, as a result of convection, rises up to the ceiling of the clean room. This ensures that, in the area of the processing locations of the semiconductor products, there is virtually only cleaned feed air, and the feed air does not mix with the waste air in this area. This means that, in the area of the processing locations of the semiconductor products, air with a prescribed purity level and, if appropriate, at the required temperature and humidity, is available.

In accordance with an additional feature of the invention, the feed air is fed into completely or partly sealed-off production devices via blowing devices. In this case, the feed air is led to the respective blowing device from the floor of the clean room via a duct system. In this case, the blowing devices are fitted in the immediate vicinity of the production devices within the production unit. This is advantageous because the feed air is provided immediately where it is needed with a predefined purity level. Any impairment by contaminated waste air can virtually completely be ruled out in the case of this configuration.

In accordance with another feature of the invention, the fitting locations of the blowing devices are normally located close to the floor of the clean room, so that the duct system only requires short distances from the floor of the clean room to the blowing devices. This leads to little energy expenditure and costs in the air supply. The contaminated and heated waste air located in the production unit rises upward as a result of convection. This thermal movement of the waste air is utilized in order to extract it with little energy expenditure via the ceiling or open top of the production unit and to lead it through the ceiling of the clean room.

In accordance with a further feature of the invention, the air supply system is constructed to feed the feed air into the plurality of the production units. The plurality of production units include production devices, and the plurality of the production units include docking stations for introducing the feed air. The docking stations are located directly adjacent the production devices.

In accordance with a further added feature of the invention, there is provided, an extraction device for extracting the waste air. The extraction device is located above the ceiling of one of the production units.

In accordance with a further additional feature of the invention, there is provided, an extraction device, for extracting the waste air, which is located above the ceiling of the clean room.

In accordance with yet an added feature of the invention, there is provided, a collecting device for collecting the waste air. The collecting device is provided at a location that is selected from the group consisting of a location that is in the ceiling of the clean room and a location that is above the ceiling of the clean room.

In accordance with a concomitant feature of the invention, there is provided, a collecting device for collecting the waste air. The collecting device is provided at a location that is selected from the group consisting of a location that is in the ceiling of one of the production units and a location that is above the ceiling of one of the production units.

Other features which are considered as characteristic for the invention are set forth in the appended claims.

Although the invention is illustrated and described herein as embodied in a Plant for producing semiconductor products, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
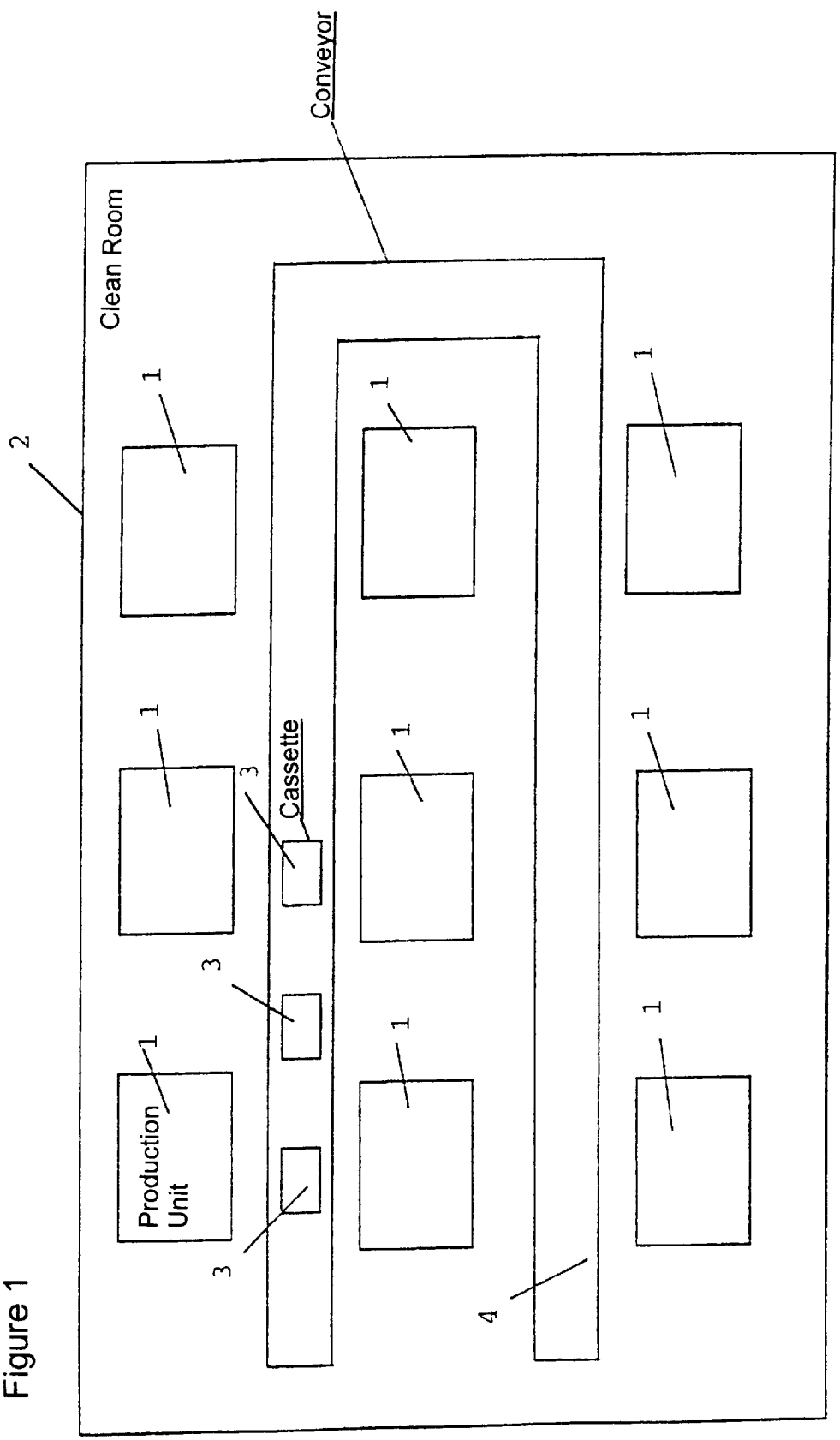
FIG. 1 shows a schematic representation of a plant for processing wafers that has a plurality of production units located in a clean room.

Referring now to the figures of the drawing in detail and first, particularly, to FIG. 1 thereof, there is shown a configuration of production units 1 belonging to a plant for processing wafers. The production units 1 are configured in a clean room 2 and are used to carry out the production processes which arise during processing of the wafers. These production processes include, in particular, etching processes, wet chemical processes, diffusion processes and cleaning processes. In addition, in the production units 1, measuring processes that are needed to monitor the processing quality of the individual production processes are carried out. One or more production units 1 is or are provided for all the production processes.

The production units 1 are connected via a transport system. Cassettes 3 that are filled with wafers are fed to the production units 1 via the transport system. The transport system has a conveyor system, on which the cassettes 3 are transported. In the present exemplary embodiment, the conveyor system includes a plurality of interlinked roller conveyors 4. In addition, the transport system can have a predefined number of storage devices (not illustrated) for temporarily storing the wafers.

Figure 2:
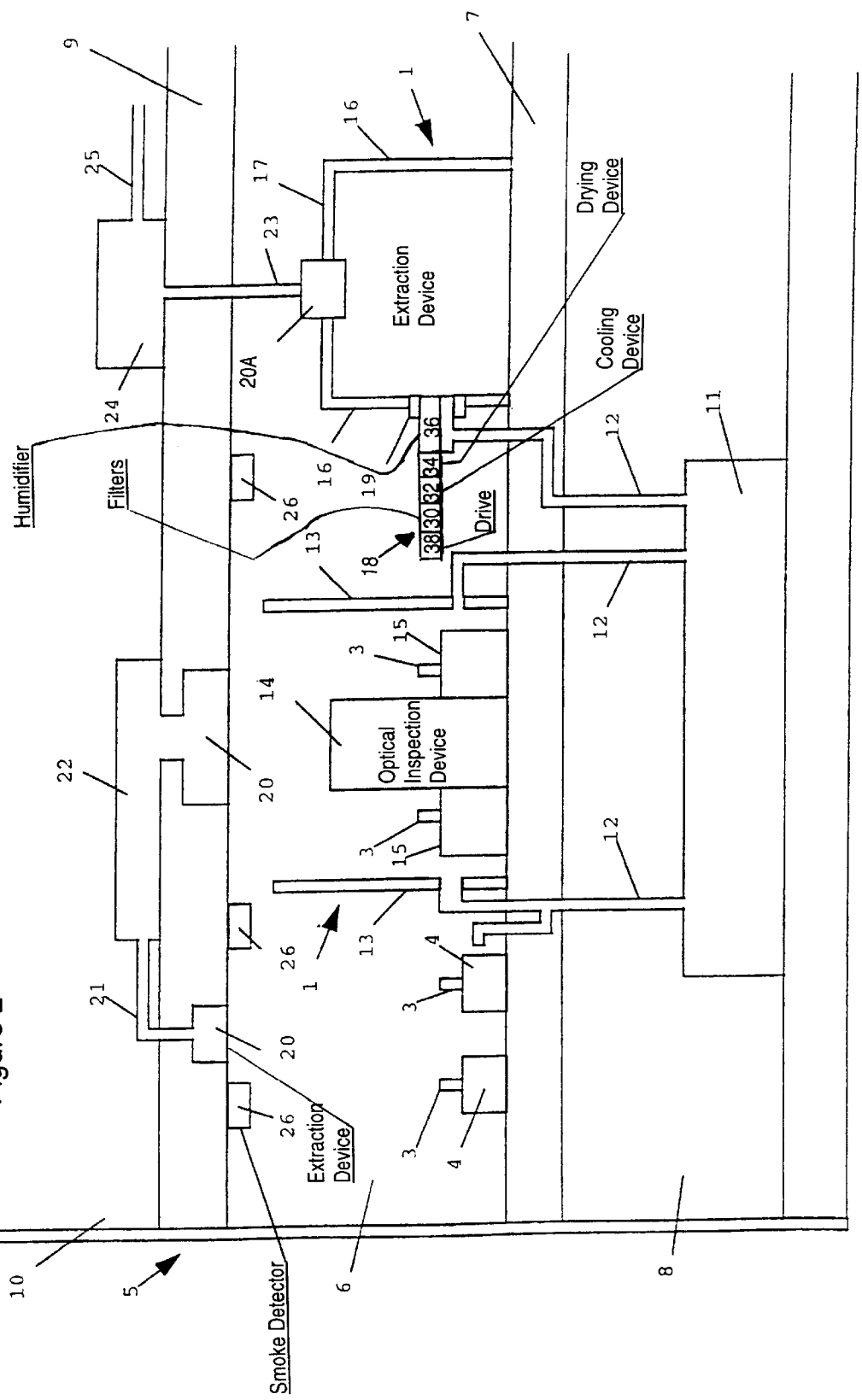
FIG. 2 shows a cross section through a building having a clean room that is configured on one floor and an air supply system for the clean room.

As can be seen from FIG. 2, the production unit 1 is located in a building 5. The clean room 2 with the production units 1 is located on one floor 6 of the building 5. In this case, FIG. 2 illustrates part of this building 5 in schematic form.

An air supply system is provided for the clean room 2, by means of which, feed air is fed in via the floor 7 of the clean room 2. The equipment necessary for the air supply system is therefore substantially located on the floor 8 underneath the clean room 2. By contrast, waste air is led away via the ceiling 9 of the clean room 2, with the result that equipment for this purpose is configured on the floor 10 above the clean room 2.

The waste air that is carried away from the clean room 2 and also the feed air to be fed to the clean room 2, circulate in an air circulation system (not illustrated). Fresh air is fed to the latter as required from outside the building 5. The contaminated waste air is carried away from the clean room 2 and is cleaned in order then to be fed again into the clean room 2 as feed air. If necessary the cleaned air is mixed with fresh air.

In the exemplary embodiment illustrated in FIG. 2, a supply container 11 with cleaned feed air is provided on the floor 8 underneath the clean room 2. From this supply container 11, a duct system having a plurality of lines 12 leads through the floor 7 of the clean room 2.

According to the invention, the feed air is guided directly via the lines 12 to the locations in the clean room 2 at which the wafers are processed. This means that the feed air is fed in directly where a predefined purity level of the feed air is needed.

One example of this is a transfer station for wafers on the conveyor system of the transport system. As illustrated in FIG. 2, two roller conveyors 4 run in sections of the area of the floor 7 of the clean room 2, at a small distance from each other. This area forms the transfer station. There, by means of grippers which are not illustrated or by means of the operating personnel, cassettes 3 with wafers can be transferred from one roller conveyor 4 to the other. In the case of transfer stations formed in this way, the requirement on the cleanness of the feed air is not particularly high. It is therefore sufficient for the feed air to be led out directly to the transfer station via the lines 12 in the floor 7 of the clean room 2, without any further cleaning measures. Since the transfer station is located at a small height above the floor 7 of the clean room 2, the energy expenditure for feeding the feed air from the floor 7 of the clean room 2 is correspondingly low.

In addition, FIG. 2 shows a production unit 1 which is separated from the rest of the clean room 2 by wall elements 13. The wall elements 13 enclose a staff workplace 14 which, for example, is constructed as an optical inspection device. In this case, the wall elements 13 do not extend as far as the ceiling 9 of the clean room 2, so that an interspace remains between the ceiling 9 and the production unit 1, through which interspace, an exchange of air with the remainder of the clean room 2 takes place. The cassettes 3 with wafers are set down on set-down surfaces 15. The staff then remove individual wafers in order to inspect them with optical instruments, for example, with microscopes or the like, for their processing quality. In this case, the feed air is fed via the lines 12 of the duct system, which pass through the wall elements 13 of the production unit 1 at approximately the height of the set-down surfaces 15. In this way, the cleaned feed air is fed directly to the wafers on the set-down surfaces 15. This means that, in the area of the wafers, the feed air is not mixed with the used waste air, so that at the processing location of the wafers the necessary cleanliness requirements on the surrounding air are complied with. Furthermore, it is advantageous that the feed is carried out directly above the floor 7 of the clean room 2, so that the feed air can be fed to the production unit 1 without great energy expenditure.

Finally, FIG. 2 illustrates a further production unit 1, which is formed by a machine or plant. The production unit 1 is divided off from the rest of the clean room 2 on all sides by wall elements 16 and a ceiling 17, so that there is no exchange of air between the interior of the production unit 1 and the clean room 2. This production unit 1 is, for example, a plant for cleaning wafers, in which there are very high cleanness requirements on the air in the interior of the production unit 1.

In this case, the feed air is blown into the interior of the production unit 1 by a blowing device 18 connected to lines 12 belonging to the duct system. The blowing device 18 has a noise-reduced drive 38 and filters 30 for cleaning the feed air. The blowing device 18 is in this case located in a docking station 19 in a wall element 16 of the production unit 1. Here, the fitting height of the docking station 19 is selected such that the feed air is blown in at the same height as that at which the wafers are processed in production units (not illustrated) in the production unit 1. The feed air is thus again guided into the production unit 1 directly at the processing locations for the wafers. This prevents mixing of the cleaned feed air with contaminated waste air from taking place there. Typically, the installation heights of such blowing devices 18 are in the range between 0.5 m and 1.5 m. This means that the distances of the lines 12 from the floor 7 of the clean room 2 to the blowing devices 18 are very short, so that only a low energy expenditure is needed to lead the feed air in.

It is normal for feed air to be needed in the production unit 1 at predefined temperatures which lie below the temperature in the clean room 2. Therefore, a cooling device 32 is additionally provided in or on the blowing device 18.

In addition, defined requirements on the moisture content of the feed air are also placed on the feed air in such production units 1. For this purpose, the appropriate blowing devices 18 additionally have devices 34 for drying or devices 36 for humidifying the feed air.

In order to meet the requirements on the temperature and the moisture content of the feed air, it is in turn necessary for the blowing devices 18 to be fitted in the immediate vicinity of the processing locations of the wafers. Only then is it ensured that the wafers have the feed air applied directly to them, and that no mixing with the waste air in the clean room 2 takes place.

In the air supply system according to the invention, use is made of the fact that the used waste air in the clean room 2 or in the production units 1 is warmer than the feed air and therefore rises upward as a result of convection. Accordingly, the waste air is led out via the ceilings 17 of the production units 1 and via the ceiling 9 of the clean room 2. In the exemplary embodiment of the clean room 2 illustrated in FIG. 2, two extraction devices 20 are provided in the ceiling 9 for this purpose. Depending on the quantity of waste air to be extracted from the clean room 2, further extraction devices 20 (not illustrated) can be provided on the ceiling 9. Since the heated waste air moves upward as a result of convection, the energy requirement for these extraction devices 20 is relatively low.

The extraction devices 20 shown in FIG. 2 are configured above the transfer station on the transport system and above the production device 1 that is constructed as a staff workplace 14. Thus, by using these extraction devices 20, waste air is extracted from these areas.

From the extraction devices 20, the waste air is guided directly or via lines 21 belonging to a duct system into a collecting device 22 and is collected there. From there, the waste air is fed to the air circulation system (not illustrated). For this purpose, blowers, line systems and the like, not shown, can be provided.

The production unit 1 (shown at the right side) that is constructed as a machine or plant and is separated in an airtight manner from the rest of the clean room 2 likewise has an extraction device 20A located on its ceiling 17. Via this extraction device 20A, contaminated waste air in the production unit 1 is extracted. The waste air is heated by the processing operations within the production unit 1 and rises upward as a result of convection, which means that the extraction by the extraction device 20A is assisted. The energy requirement for the extraction device 20A is correspondingly low. From the extraction device 20A, the waste air is guided through the ceiling 9 of the clean room 2 via lines 23 belonging to the duct system, and is fed to a further collecting device 24. From there, the waste air is fed to the air circulation system via a further line 25.

Since the waste air in the clean room 2 is extracted upward, it is removed directly from the processing locations of the wafers, which are typically located in the floor area of the clean room 2. This upward movement is assisted by the convection of the waste air, since the feed air supplied is colder than the waste air. The feed air, which is fed in from the floor 7 of the clean room 2 and directly to the processing locations of the wafers in the production units 1 or onto the transport system, therefore displaces the waste air in these areas.

This means that, in these areas, mixing of the feed air and waste air is largely avoided. This means that, at the processing locations for the wafers, feed air with the required purity level and at the necessary temperature and moisture is available, which leads to a correspondingly high processing quality of the wafers.

In addition, it is advantageous that, not only the warmed waste air but, in the case of a fire, also smoke is extracted toward the ceiling 9 of the clean room 2 by the extraction devices 20. Therefore, the efficiency of smoke detectors 26 fitted to the ceiling 9 of the clean room 2 is also considerably increased.

I claim:

1. A plant for producing semiconductor products, comprising:
    at least one clean room having a floor;
    a plurality of production units disposed in said at least one clean room, said plurality of said production units defining processing locations for processing the semiconductor products, said processing locations located near said floor of said clean room; and
    an air supply system for directly feeding in feed air at said processing locations through said floor of said clean room.
2. The plant according to claim 1, comprising:
    a transport system for transporting the semiconductor products;
    said air supply system feeding the feed air onto said transport system.
3. The plant according to claim 1, wherein said air supply system is constructed to feed the feed air into said plurality of said production units.
4. The plant according to claim 1, comprising a duct system for supplying the feed air to said processing locations, said duct system running in said floor of said clean room.
5. The plant according to claim 1, comprising blowing devices for feeding the feed air into said clean room.
6. The plant according to claim 5, wherein each one of said blowing devices includes a filter for cleaning the feed air and a noise-reduced drive.
7. The plant according to claim 5, wherein said blowing devices include cooling devices for cooling the feed air.
8. The plant according to claim 5, wherein said blowing devices include devices that are selected from the group consisting of devices for drying the feed air and devices for humidifying the feed air.
9. The plant according to claim 1, wherein:
    said air supply system is constructed to feed the feed air into said plurality of said production units;
    said plurality of said production units include production devices;
    said plurality of said production units include docking stations for introducing the feed air; and
    said docking stations are located directly adjacent said production devices.
10. The plant according to claim 9, wherein said docking stations are installed at a height from said floor that is in a range from 0.5 m to 1.5 m.
11. The plant according to claim 1, wherein said clean room has a ceiling through which waste air is led out.
12. The plant according to claim 11, wherein at least one of said plurality of said production units is constructed with a ceiling through which waste air is led out.
13. The plant according to claim 12, comprising a duct system guiding the waste air from said ceiling of said one of said production units toward said ceiling of said clean room.
14. The plant according to claim 12, comprising:
    an extraction device for extracting the waste air;
    said extraction device located above said ceiling of said one of said production units.
15. The plant according to claim 11, comprising:
    an extraction device for extracting the waste air;
    said extraction device located above said ceiling of said clean room.
16. The plant according to claim 11, comprising:
    a collecting device for collecting the waste air;
    said collecting device is provided at a location that is selected from the group consisting of a location that is in said ceiling of said clean room and a location that is above said ceiling of said clean room.
17. The plant according to claim 11, comprising:
    a collecting device for collecting the waste air;
    at least one of said plurality of said production units being constructed with a ceiling;
    said collecting device is provided at a location that is selected from the group consisting of a location that is in said ceiling of said one of said production units and a location that is above said ceiling of said one of said production units.
18. The plant according to claim 1, comprising smoke detectors that are provided on said ceiling of said clean room.
19. The plant according to claim 12, comprising:
    smoke detectors provided on said ceiling of said at least one of said production units.
20. A plant for producing semiconductor products, comprising:
    at least one clean room having a ceiling for waste air to be led out and a floor;
    a plurality of production units disposed in said at least one clean room, said plurality of said production units defining processing locations for processing the semiconductor products, said processing locations located near said floor of said clean room; and an air supply system for directly feeding in feed air at said processing locations through said floor of said clean room;

at least one of said plurality of said production units being constructed with a ceiling through which waste air is led out.

21. The plant according to claim 20, further comprising:

a transport system for transporting the semiconductor products;

said air supply system feeding the feed air onto said transport system.

22. The plant according to claim 20, wherein said air supply system Leeds the feed air into said plurality of said production units.

23. The plant according to claim 20, further comprising a duct system for supplying the feed air to said processing locations, said duct system running in said floor of said clean room.

24. The plant according to claim 20, further comprising blowing devices for feeding the feed air into said clean room.

25. The plant according to claim 24, wherein each one of said blowing devices includes a filter for cleaning the teed air and a noise-reduced drive.

26. The plant according to claim 24, wherein said blowing devices include cooling devices for cooling the feed air.

27. The plant according to claim 24, wherein said blowing devices include devices that are selected from the group consisting of devices for drying the feed air and devices for humidifying the feed air.

28. The plant according to claim 20, wherein:

said air supply system feeds the feed air into said plurality of said production units;

said plurality of said production units include production devices; and said plurality of said production units include docking stations for introducing the feed air, said docking stations disposed directly adjacent said production devices.

29. The plant according to claim 28, wherein said docking stations are installed at a height from said floor that is in a range from 0.5 m to 1.5 m.

30. The plant according to claim 20, further comprising a duct system guiding the waste air from said ceiling of said at least one of said production units toward said ceiling of said clean room.

31. The plant according to claim 20, further comprising:

an extraction device for extracting the waste air;

said extraction device located above said ceiling of said at least one of said production units.

32. The plant according to claim 20, comprising:

an extraction device for extracting the waste air, said extraction device disposed above said ceiling of said clean room.

33. The plant according to claim 20, further comprising:

a collecting device for collecting the waste air, said collecting device is provided at a location selected from the group consisting of a location that is in said ceiling of said clean room and a location that is above said ceiling of said clean room.

34. The plant according to claim 20, further comprising a collecting device for collecting the waste air;

wherein at least one of said plurality of said production units has a ceiling;

wherein said collecting device is provided at a location that is selected from the group consisting of a location that is in said ceiling of said one of said production units and a location that is above said ceiling of said one of said production units.

35. The plant according to claim 20, further comprising smoke detectors that are provided on said ceiling of said clean room.

36. The plant according to claim 20, further comprising;

smoke detectors provided on said ceiling of said at least one of said production units.

* * * * *